United States Patent
Ratnakumar et al.

(10) Patent No.: US 7,436,710 B2
(45) Date of Patent: Oct. 14, 2008

(54) EEPROM MEMORY DEVICE WITH CELL HAVING NMOS IN A P POCKET AS A CONTROL GATE, PMOS PROGRAM/ERASE TRANSISTOR, AND PMOS ACCESS TRANSISTOR IN A COMMON WELL

(75) Inventors: Nirmal Ratnakumar, San Jose, CA (US); Venkatraman Prabhakar, Pleasanton, CA (US); David Kuan-Yu Liu, Fremont, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 4 days.

(21) Appl. No.: 11/685,111

(22) Filed: Mar. 12, 2007

(65) Prior Publication Data
US 2008/0225601 A1    Sep. 18, 2008

(51) Int. Cl.
*G11C 11/34* (2006.01)

(52) U.S. Cl. .............................. 365/185.18; 365/185.14; 365/185.1

(58) Field of Classification Search ............ 365/185.18, 365/185.14, 185.1, 185.01, 185.26, 185.27, 365/185.28, 185.29, 218
See application file for complete search history.

(56) References Cited

U.S. PATENT DOCUMENTS

| 7,002,865 B2 * | 2/2006 | Agata et al. ................. 365/207 |
| 2005/0030827 A1 * | 2/2005 | Gilliland et al. ............. 365/232 |

* cited by examiner

*Primary Examiner*—Dang T Nguyen
(74) *Attorney, Agent, or Firm*—Fountain Law Group, Inc.; George L. Fountain

(57) ABSTRACT

A memory device including a plurality of memory cells, each with a control gate NMOS transistor sharing a floating gate with a program/erase PMOS transistor which is, in turn, connected in series with an access PMOS transistor. The memory cells are formed in a common N-Well formed in a P-substrate, the NMOS transistor being formed in a p-doped pocket or base. The program/erase PMOS includes a gate, and first and second P+ doped regions formed in the N-Well, wherein the first P+ region is electrically connected to a corresponding bit line. The access PMOS includes a gate, and first and second P+ regions formed within the N-Well, wherein the first P+ region is electrically connected to the second P+ region of the program/erase PMOS, and the gate is electrically connected to a corresponding word line. The control gate NMOS includes source, drain, and gate, wherein the source and third drain as well as the p-doped pocket are electrically connected to a corresponding control gate line, and the gate is electrically connected to the gate of the program/erase PMOS, forming floating gate of the cell.

15 Claims, 6 Drawing Sheets

PRIOR ART

| Operation | Program | Read | Block Erase | Sector Erase | Bit/Byte Erase |
|---|---|---|---|---|---|
| Selected Bit Line | 0 V | Vcc | Verase | Verase | Verase |
| Unselectd Bit Line | Float | Float | N/A | N/A | 0 V |
| Selected Word Line | 0V | 0V | Vcc | Vcc | Verase |
| Unselected Word Line | Vprog | Vcc | N/A | Vcc | Verase |
| Selected CG Line | Ramp from Vcg1 to Vcg2 or Vcg3 | 0 | Vcg_era | Vcg_era | Vcg_era |
| Unselected CG Line | Vcc | Vcc | N/A | Vcc/0V | Vcc/0V |
| V_array | Vprog | Vread | Float | Float | Float |
| NWell | Vprog | Vcc | Verase | Verase | Verase |

EEPROM MEMORY DEVICE WITH CELL HAVING NMOS IN A P POCKET AS A CONTROL GATE, PMOS PROGRAM/ERASE TRANSISTOR, AND PMOS ACCESS TRANSISTOR IN A COMMON WELL

FIELD OF THE INVENTION

This invention relates generally to electrical erasable programmable read only memory (EEPROM) devices, and in particular, to an EEPROM device comprising an array of cells each having an n-doped channel metal oxide semiconductor (NMOS) transistor situated in a p-doped pocket sharing a floating gate (FG) with a program/erase p-doped metal oxide semiconductor (PMOS) transistor connected in series with an access PMOS transistor. All of these devices are formed in a common n-doped well (N-Well) formed within a p-doped substrate (P-Substrate).

BACKGROUND OF THE INVENTION

Electrical erasable programmable read only memory (EEPROM) devices are continuously being developed to provide improved characteristics. Some of these developments include improving the ease of manufacturing the device, or adding new improvements without significantly compromising the manufacturing process of the device; increasing the density of the memory cells of the device to provide higher memory capacity for a given integrated circuit (IC) chip area; improving the reliability of the device to improve data retention and extend erase and programmable life span; improving the program efficiency and flexibility of the device to achieve lower programmable voltages and currents, and provide bit and byte programming of memory cells; and improving the erase efficiency and flexibility of the device to similarly achieve lower erase voltages, and provide bit, byte, sector, and/or array erasing of memory cells.

In the past, EEPROM devices have had shortcomings with respect to at least some of these characteristics. For instance, their memory cell structure and layout are generally inefficient resulting in relatively large memory cell size, relatively low data retention, limited erasing and programming life span, relatively high programmable voltages and currents, and relatively high erase voltages. These shortcomings are better explained below with reference to a particular conventional EEPROM device.

FIG. 1A illustrates a schematic diagram of an exemplary conventional EEPROM device 100. In this example, the EEPROM device 100 is shown to include an array of four (4) memory cells 102a-d for illustrative purposes. However, it is well known that typical EEPROM devices include arrays with much more memory cells (e.g., $10^3$-$10^6$ memory cells, or higher). In this example, memory cells 102a and 102b share word line WL1, and memory cells 102c and 102d share word line WL2. Also, memory cells 102a and 102c share bit line BL1, and memory cells 102b and 102d share bit line BL2. In this example, the memory cells 102a-d are formed in and on a p-doped substrate (P-substrate) 104.

Each memory cell (102a-d) consists of an erase p-doped channel metal oxide semiconductor (PMOS) transistor (110a-d), a program PMOS transistor (114a-d), and an access n-doped channel metal oxide semiconductor (NMOS) transistor (118a-d). Each erase PMOS transistor (110a-d) is formed in a separate n-doped well (N-Well) (112a-d) formed in the P-substrate 104. Each program PMOS transistor (114a-d) is also formed in a separate N-Well (116a-d) in the P-substrate 104. Each access NMOS transistor (118a-d) is formed in a separate p-doped well (P-Well) (120a-d) formed in the P-substrate 104.

The sources (S), drains (D), and N-Wells 112a-b of the erase PMOS transistors 110a-b of the memory cells 102a-b are respectively electrically connected together, and connected to Erase Line 1. Similarly, the sources (S), drains (D), and N-Wells 112c-d of the erase PMOS transistors 110c-d of the memory cells 102c-d are respectively electrically connected together, and connected to the Erase Line 2. The sources (S) of the program PMOS transistors 114a and 114c of the memory cells 102a and 102c are electrically connected to the bit line BL1. Similarly, the sources (S) of the program PMOS transistors 114b and 114d of the memory cells 102b and 102d are electrically connected to the bit line BL2. The gate of each of the PMOS erase transistor (110a-d) is electrically connected to the gate of the corresponding program PMOS transistor (114a-d), which forms the floating gate (FG) for the memory cell (102a-d).

The drain (D) of each program PMOS transistor (114a-d) is electrically connected to the drain (D) of the corresponding access NMOS transistor (118a-d). The sources (S) of the access NMOS transistors 118a-d are electrically connected to ground potential (Gnd). The gates (G) of the access NMOS transistors 118a-b of the memory cells 102a-b are electrically connected to the word line WL1. The gates (G) of the access NMOS transistors 118c-d of the memory cells 102c-d are electrically connected to the word line WL2.

FIG. 1B illustrates a layout of the exemplary conventional memory cell 102a. The layout of the memory cell 102a is typically the same for the other memory cells 102b-d of the EEPROM device 100. As shown, the source (S) and drain (D) of the erase PMOS transistor 110a, in addition to being electrically connected together and to the Erase Line 1, is connected to the N-well 112a via a highly n-doped contact 111a. The source (S) of the program PMOS transistor 114a, in addition to being connected to the bit line BL1, is connected to the N-Well 116a via a highly n-doped contact 115a. Also, the source (S) of the access NMOS transistor, in addition to being electrically connected to ground potential, is connected to the P-Well 120a via a P+contact 119a.

FIG. 1C illustrates a schematic cross-section of the erase PMOS transistor 110a and program PMOS transistor 114a of conventional EEPROM device 100. As shown, the sources (S) and drains (D) of both the erase and program PMOS transistors 110a and 114a comprise a P+ contact region adjacent to a lighter P-doped region within the channel. The lighter P-doped region is typically employed to prevent avalanche breakdown due to high electric fields along the edges of the source (S) and drain (D) regions.

As discussed above, the conventional EEPROM device 100 has some shortcomings with regard to memory cell density, reliability, programming and erasing characteristics. For example, with regard to memory cell density, the memory cell includes separate N-Wells for the erase and program PMOS transistors. In addition, the spacing between the adjacent N-Wells is relatively large to ensure proper electrical isolation. Further, the memory cell includes a relatively large NMOS access transistor to carry the relatively large voltage and current needed for programming the cell while keeping the voltage drop Vds in the NMOS relatively small. These factors result in a memory cell occupying a relatively large chip area, which makes it difficult to provide higher memory cell density for this type of EEPROM device.

With regard to reliability, the large floating gate (FG) including the erase and program PMOS transistors results in a relatively large area, which results in larger current leakage.

This adversely affects the data retention capability of the conventional EEPROM device. Because of the relatively large floating gate area, larger voltages and currents are generally needed for programming the memory cells. The relatively large program voltages also generally have an adverse effect on the programmable lifespan. Additionally, higher erase voltages are needed for erasing the memory cells.

SUMMARY OF THE INVENTION

An aspect of the invention relates to a memory device, such as an electrical erasable programmable read only memory (EEPROM) device. The memory device comprises a p-doped substrate, a plurality of electrically-conductive bit lines extending along a bit line direction, a plurality of electrically-conductive word lines extending along a word line direction, a plurality of electrically-conductive control gate lines extending along the word line direction, and a plurality of memory cells arranged along the bit and word lines.

Each memory cell, in turn, comprises a program/erase PMOS transistor including a gate, and first and second P+ regions formed within an n-doped well, wherein the first P+ region of the program/erase PMOS transistor is electrically connected to a corresponding bit line. Each memory cell further comprises an access PMOS transistor including a gate, and first and second P+ regions formed within the n-doped well. The first P+ region of the access PMOS transistor is electrically connected to the second P+ region of the program/erase PMOS transistor, and may be a common P+ region. The gate of the access PMOS transistor is electrically connected to a corresponding word line. Each memory cell further comprises a control gate NMOS transistor including source, drain, and gate, wherein the source and drain are electrically connected to a corresponding control gate line and shorted to a p-type pocket or base. The gate of the NMOS transistor is electrically connected to the gate of the program/erase PMOS transistor, both serving as the floating gate of the memory cell.

Another aspect of the invention relates to a method of programming a selected memory cell. In this case, the method applies to a memory cell comprising a selected program/erase PMOS transistor, a selected access PMOS transistor connected in series with the selected program/erase PMOS transistor, and a selected control gate NMOS transistor sharing a floating gate with the selected program/erase PMOS transistor. The method comprises applying a substantially ground potential to a drain of the selected program/erase PMOS transistor, applying a substantially ground potential to a gate of the selected access transistor, and applying a bias voltage (e.g., 4-7 V) to the source of the selected access PMOS transistor. The method may further include applying another voltage (e.g., 0-7 V) to the source and drain of the control gate NMOS transistor. This voltage may be substantially constant or varied in a predetermined manner (e.g., ramped). If the transistors of the memory cells are formed in a common N-Well, the method may further include biasing the N-Well with a predetermined voltage (e.g., 4-7 V).

The method may further include biasing of or configuring unselected memory cells to reduce the disturbance of stored data therein and/or to achieve other objectives while programming the selected memory cell. For example, the bit lines of unselected memory cells may be allowed to float. The word lines of unselected memory cells may be biased with a predetermined voltage (e.g., 4-7 V). The control gate lines of unselected memory cells may be biased with another predetermined voltage (e.g., 2.5-4 V).

Another aspect of the invention relates to a method of reading a selected memory cell. In this case, the method applies to a memory cell comprising a selected program/erase PMOS transistor, a selected access PMOS transistor connected in series with the selected program/erase PMOS transistor, and a selected control gate NMOS transistor sharing a floating gate with the program/erase PMOS transistor. The method comprises applying a first bias voltage (e.g., 2.5-4 V) to a source of the selected program/erase PMOS transistor, applying a substantially ground potential to a gate of the selected access transistor, and applying a second bias voltage (e.g., the first voltage minus 0.5 to 2 Volt) to a drain of the selected access transistor. The method may further include applying substantially ground potential to the drain and source of the selected control gate NMOS transistor. If the transistors of the memory cells are formed in a common N-Well, the method may further include biasing the N-Well with a predetermined voltage (e.g., 2.5-4 V).

The method may further include biasing of or configuring unselected memory cells to reduce the disturbance of stored data therein and/or to achieve other objectives while reading the selected memory cell. For example, the bit lines of unselected memory cells may be allowed to float. The word lines of unselected memory cells may be biased with a predetermined voltage (e.g., 2.5-4 V). The control gate lines of unselected memory cells may be biased with another predetermined voltage (e.g., 2.5-4 V).

Another aspect of the invention relates to a method of erasing a block, sector, byte, or bit of memory cell(s). In this case, the method applies to a memory cell comprising a program/erase PMOS transistor, an access PMOS transistor connected in series with the program/erase PMOS transistor, and a control gate NMOS transistor sharing a floating gate with the program/erase PMOS transistor.

In the case of a block erase, the method comprises applying a positive voltage (e.g., +6 Volts) to a P+ region of the program/erase PMOS transistor, and applying a negative voltage (e.g., −5 Volts) to the drain and source of the control gate NMOS transistor. The method may further comprise applying a predetermined voltage (e.g., 2.5-4 V) to the word lines (gate of the access transistors); since this gate bias is lower than the bias of the source (the P+ region of the access transistors opposite the program/erase transistor), the access transistors may conduct. But if they do, they will bring the V_array line (the P+ region of the access transistors opposite the program/erase transistor) to Verase, which does not cause any significant problem. If the transistors of the memory cells are formed in a common N-Well, the method further entails applying a bias voltage (e.g., +6 Volts) to the N-Well.

In the case of a sector erase, the method comprises applying a positive voltage (e.g., +6 Volts) to a P+ region of the program/erase PMOS transistor, and applying a negative voltage (e.g., −5 Volts) to the drain and source of the control gate NMOS transistor. The method may further comprise applying a predetermined voltage (e.g., 2.5-4 V) to the word lines (gate of the access transistors) of the selected memory cells; since this gate bias is lower than the bias of the source (the P+ region of the access transistors opposite the program/erase transistor), the access transistors may conduct. But if they do, they will being V_array line (the P+ region of the access transistors opposite the program/erase transistor) to Verase, which does not cause any significant problem. If the transistors of the memory cells are formed in a common N-Well, the method further entails applying a bias voltage (e.g., +6 Volts) to the N-Well. The method may further include biasing of or configuring unselected memory cells to reduce the disturbance of stored data therein and/or to achieve other objectives while reading the selected memory cell. For example, the word lines of unselected memory cells may be biased with a predetermined voltage (e.g., 2.5-4 V), and the control gate lines of unselected memory cells may be biased with another predetermined voltage (e.g., 0-4 V).

In the case of a bit or byte erase, the method comprises applying a positive voltage (e.g., +6 Volts) to a P+ region of the program/erase PMOS transistor, and applying a negative voltage (e.g., −5 Volts) to the drain and source of the control gate NMOS transistor. The method may further comprise applying a predetermined voltage (e.g., +6 V) to the word lines (gate of the access transistors) of the selected memory cells; allowing the V_array line (the P+ region of the access transistors opposite the program/erase transistor) to float; and if the transistors of the memory cells are formed in a common N-Well, applying a bias voltage (e.g., +6 Volts) to the N-Well. The method may further include biasing of or configuring unselected memory cells to reduce the disturbance of stored data therein and/or to achieve other objectives while reading the selected memory cell. For example, the bit lines of unselected memory cells may be substantially grounded, the word lines of unselected memory cells may be biased with a predetermined voltage (e.g., +6 V), and the control gate lines of unselected memory cells may be biased with another predetermined voltage (e.g., 0-4 V).

Other aspects, advantages and novel features of the present invention will become apparent from the following detailed description of the invention when considered in conjunction with the accompanying drawings.

BRIEF DESCRIPTION OF THE DRAWINGS

FIG. 2D illustrates a table depicting exemplary bias configurations for the exemplary EEPROM device in accordance with an embodiment of the invention.

DETAILED DESCRIPTION OF THE EXEMPLARY EMBODIMENTS

Figure 1A:
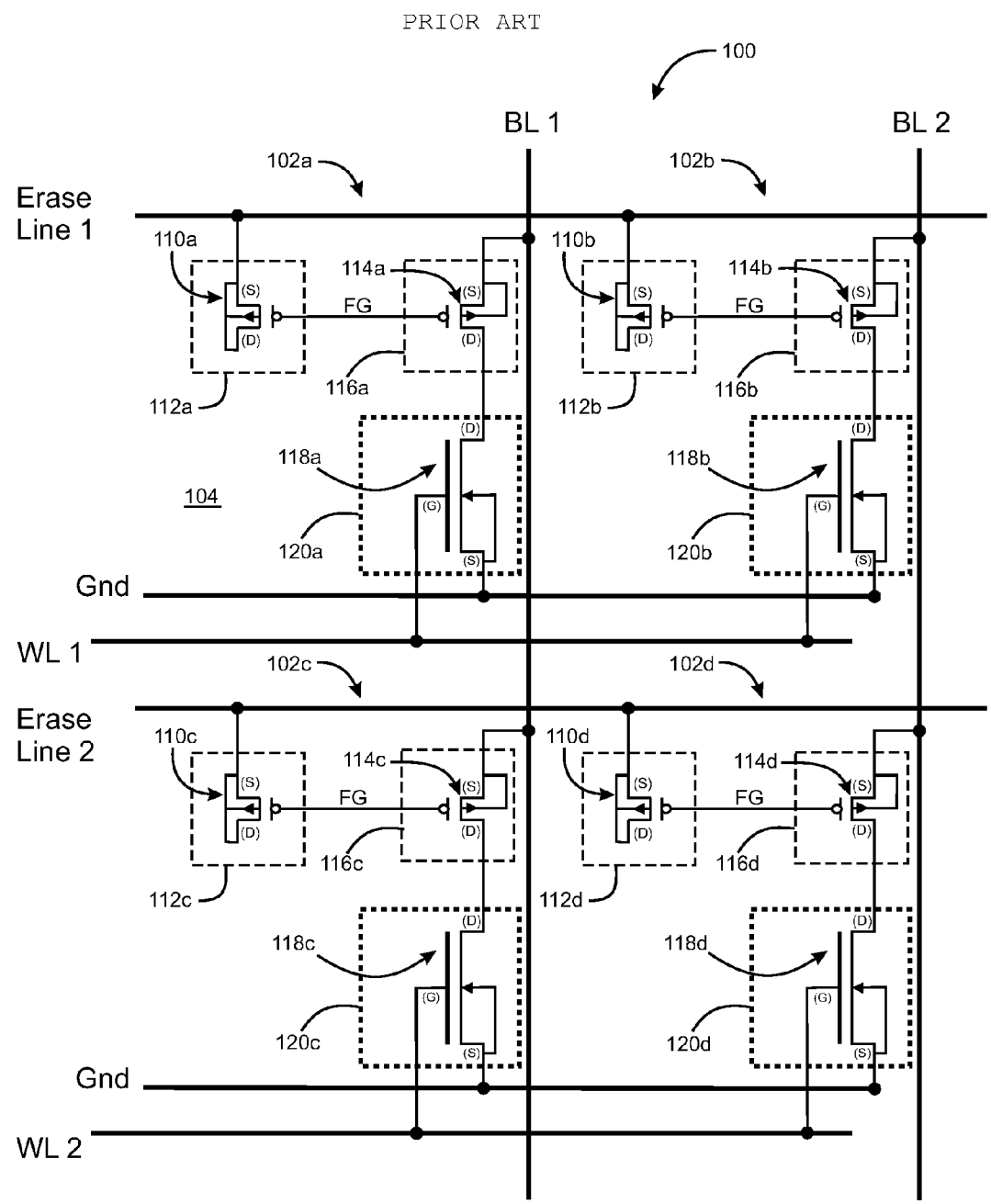
FIG. 1A illustrates a schematic diagram of an exemplary conventional EEPROM device.
Figure 1B:
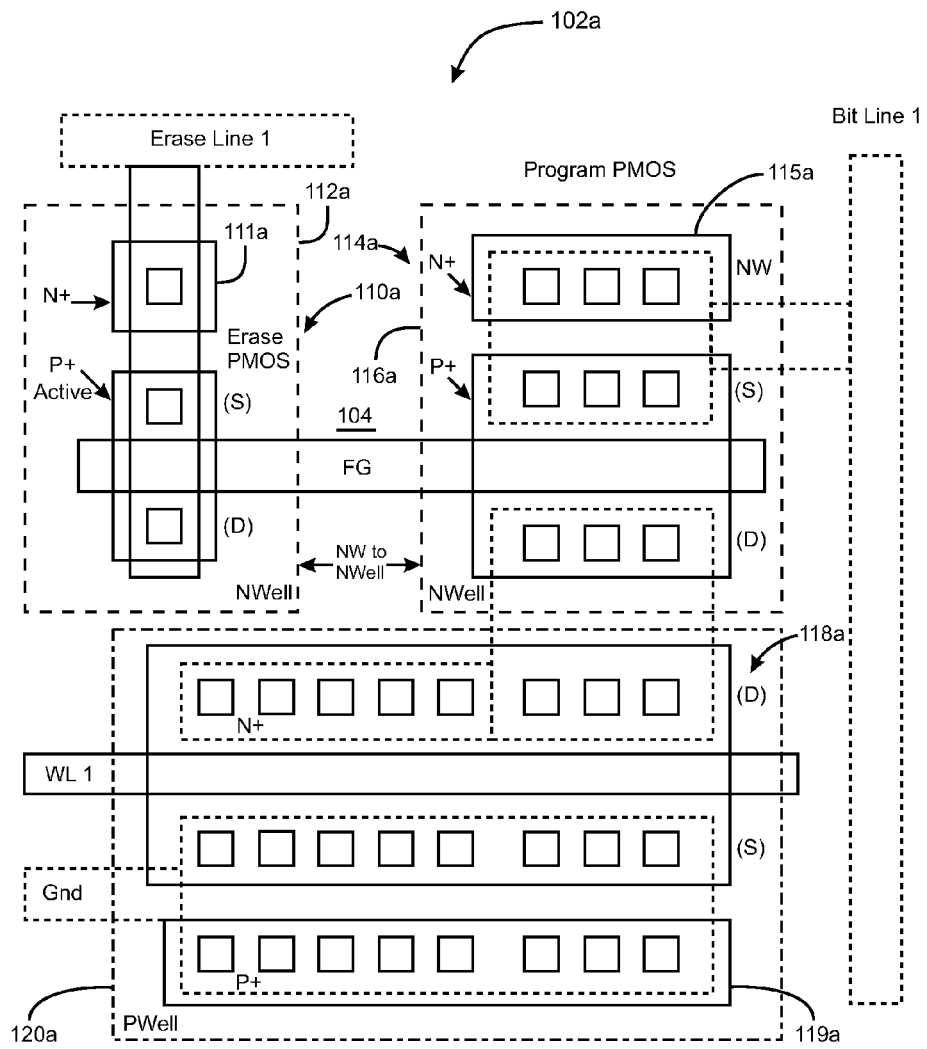
FIG. 1B illustrates a layout of the exemplary memory cell of the conventional EEPROM device.
Figure 1C:
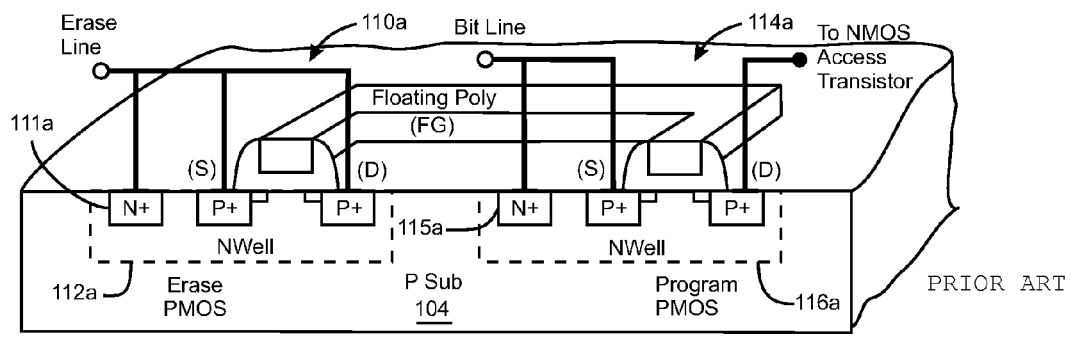
FIG. 1C illustrates a schematic cross-section of the conventional erase and program PMOS transistors of the conventional EEPROM device.
Figure 2A:
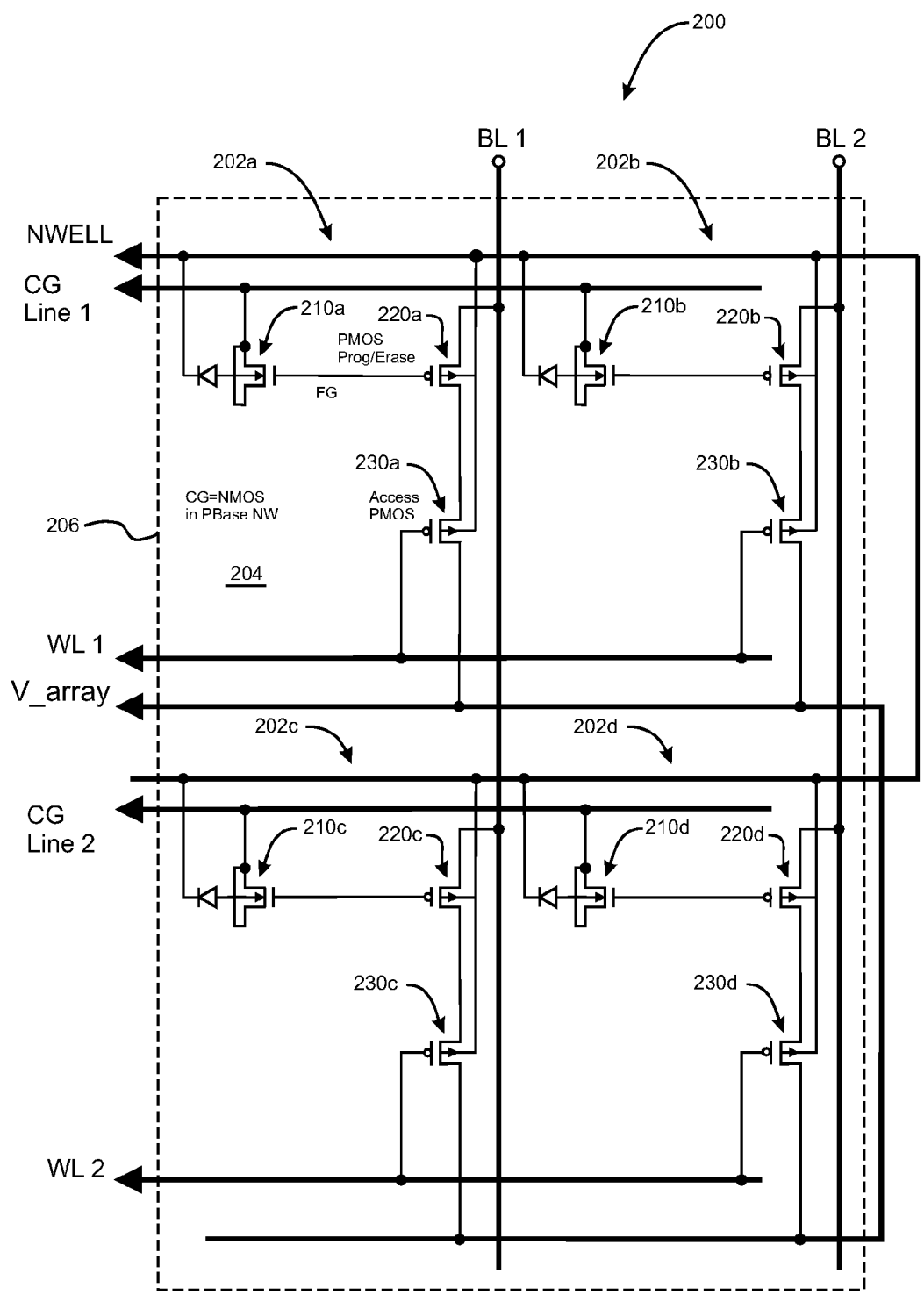
FIG. 2A illustrates a schematic diagram of an exemplary EEPROM device in accordance with an embodiment of the invention.

FIG. 2A illustrates a schematic diagram of an exemplary electrically erasable programmable read only memory (EEPROM) device 200 in accordance with an embodiment of the invention. In the exemplary embodiment, the EEPROM device 200 is shown to comprise an array of four (4) memory cells 202a-d. However, it shall be understood that the exemplary EEPROM device 200 may include an array with substantially more memory cells (e.g., $10^3$-$10^6$ memory cells, or higher). In this example, memory cells 202a-b share the same word line WL1, and memory cells 202c-d share the same word line WL2. Also, memory cells 202a and 202c share the same bit line BL1, and memory cells 202b and 202d share the same bit line BL2. In this example, the memory cells 202a-d are formed on a p-doped substrate (P-substrate) 204.

Each memory cell (202a-d) comprises a control gate (CG) n-doped metal oxide semiconductor (NMOS) ("control gate NMOS transistor") (210a-d), a program/erase p-doped metal oxide semiconductor (PMOS) transistor (220a-d), and an access PMOS transistor (230a-d). The program/erase PMOS transistor (210a-d) and access PMOS transistor (230a-d) of each memory cell are formed in the same n-doped well (N-Well) 206 formed within the P-substrate 204. The control gate NMOS transistor (210a-d) is formed within a p-doped pocket or base, which is, in turn, formed within the N-Well 206. The p-pocket or base isolates the N+ regions of the control gate NMOS transistor (210a-d) from the underlying N-Well, and enables the application of a negative voltage to its source, drain, and p-pocket with respect to the N-Well.

In the exemplary embodiment, each control gate NMOS transistor (210a-d) comprises N+ drain and source regions electrically connected together and to the p-pocket. The drain, source, and p-pocket of control gate NMOS transistors 210a-b along word line 1 are electrically connected to control gate line 1 via an electrically conductive layer (e.g., metal). Similarly, the drain, source, and p-pocket of control gate NMOS transistors 210c-d along word line 2 are electrically connected to control gate line 2 via an electrically conductive layer (e.g., metal). The gate of each control gate device (210a-d) is electrically connected to the gate of the corresponding program/erase PMOS transistor (220a-d) via an electrically-conductive layer (e.g., doped polysilicon) to form the floating gate (FG) for the corresponding cell (202a-d).

The width W and length L of the control gate NMOS transistor (210a-d) are chosen such that the gate capacitance of the device is large compared to the capacitance of the floating gate (FG) of the program/erase PMOS transistor. For example, the gate capacitance Cgp of the program/erase PMOS transistor may be represented as W1*L1*Cox, where W1 is the width of the channel, L1 is the length of the channel, and Cox is the capacitance per area of the gate oxide. Similarly, the gate capacitance Ccg of the control gate NMOS transistor may be represented as W2*L2*Cox, where W2 is the width of the channel, L2 is the length of the channel, and Cox is the capacitance per area of the gate oxide. Accordingly, the transistors may be designed so that Kg=Ccg/(Ccg+Cgp) is approximately equal to 0.7-0.9. The relatively large Kg value ensures that a large fraction of the control gate voltage is coupled to the floating gate. As discussed in more detail below, this allows about half the voltage for erasing the cell to be derived from the control gate voltage and the remaining to be derived from the bit line voltage.

The p-pocket or base on which the control gate NMOS transistor is formed can be based on a PNP transistor in a BiCMOS process. The p-pocket or base can also be based on a P-Well in a deep N-Well in a CMOS process with a deep N-Well implant to form an isolated P-Well. For CMOS processes without such a deep N-Well, the p-pocket region can be implemented by an additional P type masked implant inside the N-Well.

In the exemplary embodiment, each program/erase PMOS transistor along a bit line includes a first P+ region (drain or source) electrically connected to the corresponding bit line via an electrically-conductive layer. For example, the first P+ regions of program/erase PMOS transistors 220a and 220c are connected to bit line BL1. Similarly, the first P+ regions of program/erase PMOS transistors 220b and 220d are connected to bit line BL2. Each program/erase PMOS transistor (220a-d) includes a second P+ region (source or drain) electrically connected to a first P+ region (drain or source) of each access PMOS transistor (230a-d). The second P+ region of each program/erase PMOS transistor (220a-d) and the first P+ region of the access PMOS (230a-d) transistor may be combined into a single P+ region as shown in FIG. 2C.

Each access PMOS transistor (230a-d) includes a second P+ region (source or drain) electrically connected to a bias line V_array via an electrically conductive layer. The gate (G) of each access PMOS transistor is electrically connected to the corresponding word line. For example, the gates (G) of access PMOS transistors 230a-b are electrically connected to the word line WL1. Similarly, the gates (G) of access PMOS transistors 230c-d are electrically connected to the word line WL2. A bias line NWELL is provided for biasing the N-Well 206.

As discussed in more detail below, during programming, the first P+ regions of the program/erase and access PMOS transistors serve as the respective drains of the devices, and the second P+ regions of the program/erase and access PMOS transistors serve as the respective sources of the devices. During reading, the first P+ regions of the program/erase and access PMOS transistors serve as the respective sources of the devices, and the second P+ regions of the program/erase and access PMOS transistors serve as the respective drains of the devices.

Figure 2B:
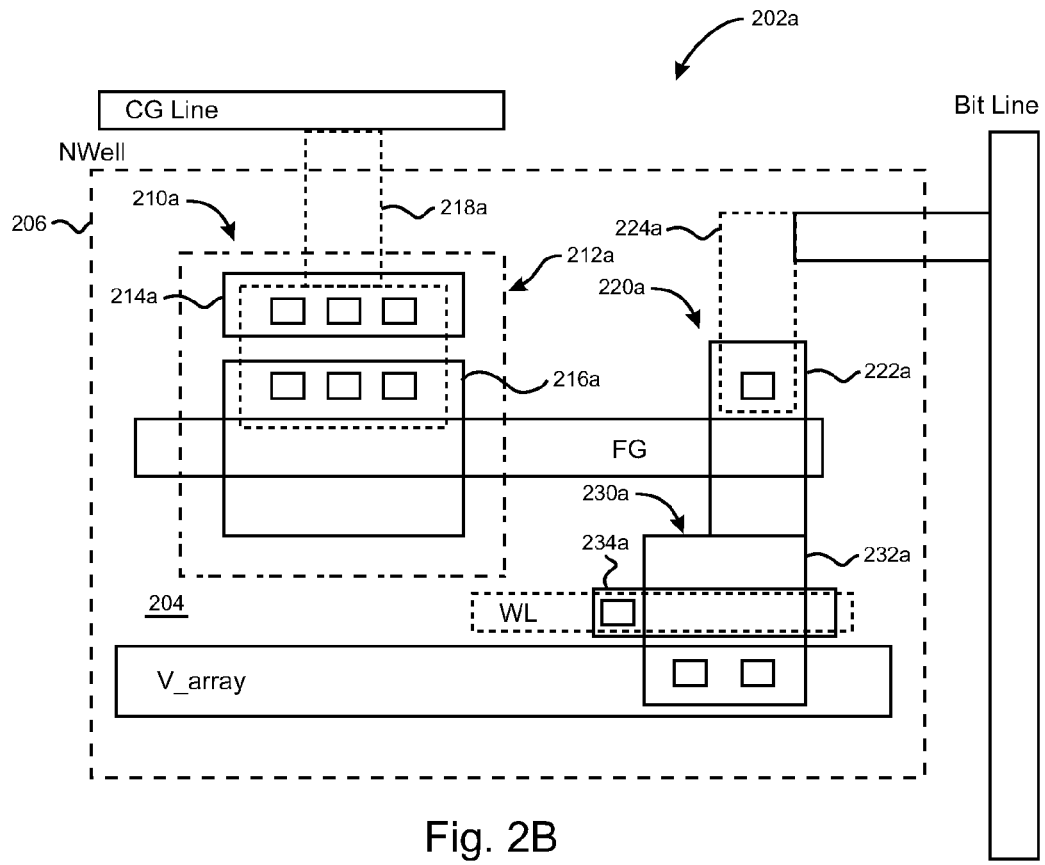
FIG. 2B illustrates a layout of an exemplary memory cell in accordance with an embodiment of the invention.
Figure 2C:
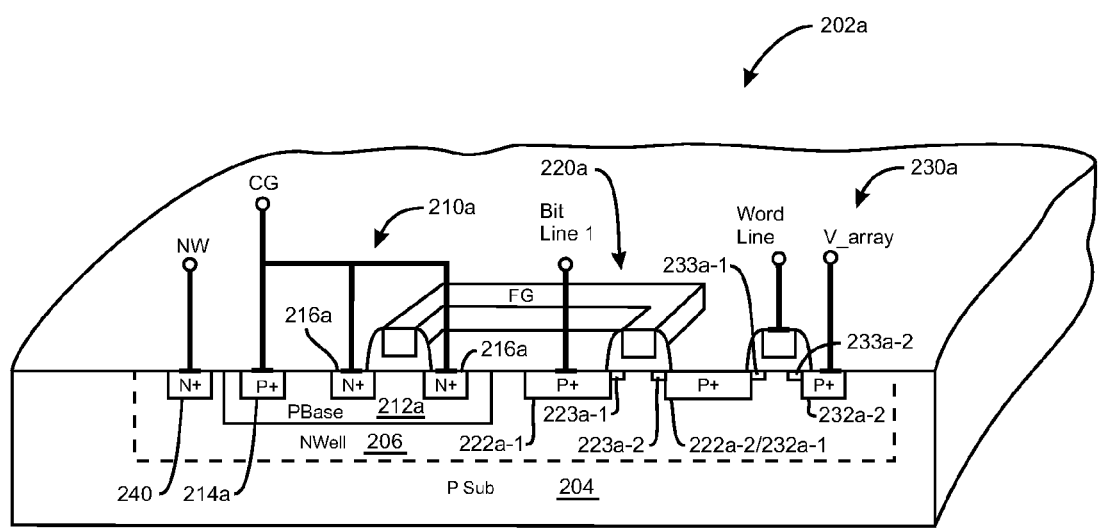
FIG. 2C illustrates a schematic cross-section of the exemplary memory cell in accordance with an embodiment of the invention.

FIG. 2B illustrates a layout of the exemplary memory cell 202a in accordance with an embodiment of the invention. The layout for memory cell 202a may be the same as the layouts for the remaining memory cells 202b-d. As shown, the control gate NMOS transistor 210a comprises a p-doped pocket (also known as a base) 212a formed within the N-Well 206, a P+ diffusion region 214a for providing an electrical contact to the p-doped pocket 212a, and an N+ source (S) and drain (D) regions 216a formed within the p-doped pocket 212a. The CG Line, which could be an electrically-conductive layer (e.g., metal), is electrically connected to the P+ diffusion region 214a and the N+ diffusion regions 216a via an electrically-conductive layer (e.g., metal) 218a. The floating gate (FG), may be comprised of an electrically-conductive layer (e.g., doped polysilicon), which extends from the channel of the control gate NMOS transistor 210a to the channel of the program/erase PMOS transistor 220a.

As shown, the program/erase PMOS transistor 220a comprises a P+ region 222a serving as the first and second P+ regions of the device. The bit line, which is formed of an electrically-conductive layer (e.g., metal), is electrically coupled to the P+ region 222a via an electrically-conductive layer 224a. The access PMOS transistor 230a comprises a P+ region 232a serving as the first and second P+ diffusion regions of the device. The P+ region 232a of the access PMOS transistor 230a may overlap with the P+ region 222a of the program/erase PMOS transistor 220a. The gate 234a of the access PMOS transistor 230a, which may be formed of doped polysilicon, is electrically connected to the word line WL1 (e.g., a metal line). The P+ region 232a of the access PMOS transistor 230a is electrically connected to the V-Array bias line.

FIG. 2C illustrates a schematic cross-section of the memory cell 202a of the exemplary EEPROM device 200 in accordance with an embodiment of the invention. As shown, the memory cell 202a comprises the control gate NMOS transistor 210a, the program/erase PMOS transistor 220a, and the access PMOS transistor 230a. These devices are formed in an N-Well 206 formed within the P-Substrate 204. As discussed above, the N-Well 206 is electrically connected to a bias line NW via an N+ region 240. The control gate NMOS transistor 210a is formed in a p-doped pocket (base) 212a. The control gate NMOS transistor 210a includes the P+ region 214a electrically connected to the control gate (CG) bias line. Additionally, as shown, both the N+ drain and source regions 216a of the control gate NMOS transistor 210a are formed within the p-doped pocket (base) 212a, and are electrically connected to the control gate (CG) bias line. As shown, the floating gate (FG) extends from the control gate NMOS transistor 210a to the program/erase PMOS transistor 220a.

The program/erase PMOS transistor 220a includes the first and second P+ regions 222a-1 and 222a-2, both formed within the N-Well and separated from each other by a channel. The program/erase PMOS transistor 220a may further include first and second lighter p-doped regions 223a-1 and 223a-2 respectively adjacent to the first and second P+ regions 222a-1 and 222a-2 on the channel side to form source/drain extensions to connect to the p-type channel under the gate. The first P+ region 222a-1 of the program/erase PMOS transistor 220a is electrically coupled to the bit line. The second P+ region 222a-2 of the program/erase PMOS transistor 220a may be the same as the first P+ region 232a-1 of the access PMOS transistor 230a to reduce the size of the memory cell 202a.

The access PMOS transistor 230a comprises the first P+ region 232a-1 and second P+ region 232a-2, both formed within the N-Well 206 and separated from each other by a channel. Similar to the program/erase PMOS transistor 220a, the access PMOS transistor 230a may further include first and second lighter p-doped regions 233a-1 and 233a-2 respectively as source/drain extensions adjacent to the first and second P+ regions 232a-1 and 232a-2 to connect to the p-channel. The second P+ region 232a-2 of the access PMOS transistor 230a is electrically coupled to the V_array bias line.

FIG. 2D illustrates a table depicting exemplary bias configurations for the exemplary EEPROM device 200 in accordance with an embodiment of the invention. The table depicts bias configurations for programming and reading a memory cell, erasing a block of memory cells, erasing a sector of memory cells, and performing a bit or byte erase operation. According to the table, the columns identify the operations, including program, read, block erase, sector erase, and bit/byte erase. The rows identify the biases for the selected bit line (corresponding to the memory cell(s) on which the operation is to be performed), the unselected bit line (corresponding to memory cell(s) on which the operation is not to be performed on), the selected word line, the unselected word line, the selected CG line, the unselected CG line, the V array line, and the N-Well. The exemplary biases discussed herein is for a gate oxide having an electrical oxide thickness of approximately 70 Angstroms. For other gate oxide thicknesses, the biases should be scaled accordingly.

For example, programming a memory cell involves channel current induced, hot electron injection into the floating gate (FG) at the drain of the program/erase PMOS transistor. The programming of a selected memory cell involves applying ground potential (e.g., ~0V) to the selected bit line and selected word line, and applying a programming voltage (e.g., ~4-7 Volts) to the V array line. The ground voltage on the selected word line turns on the access PMOS transistor, causing the programming voltage Vprog (e.g., ~4-7 V) to be applied to the source (S) of the program/erase PMOS transistor. Since the drain (D) of the program/erase PMOS transistor is at ground potential, the potential difference (Vds) between the drain (D) and source (S) produces a programming channel current. The channel current induces impact ionization due to high electrical field near the drain producing hot electron injection into the floating gate (FG).

To lower the programming voltage for the channel current to flow and start the programming, the bias on the selected CG line is initially close to zero. However, the programming efficiency decreases if the selected CG bias line is maintained at this low bias because the transistor will be heavily on and most of the voltage will be dropped along the channel and decreasing the electric field near the drain. To improve the programming efficiency while keeping the programming current relatively small, the selected CG line bias should be ramped up from close to zero (0) ($V_{cg1}$) to $V_{cg2}$ (equal to Vprog (e.g., 4-7 V)–$\Delta$V (e.g., 1-3 V)) to keep the program PMOS in saturation at a relatively low current and thereby maintain a high electric field near the drain. This method of ramping the CG bias also prevents hot hole injection and degradation of the gate oxide of the program/erase transistor. This is further explained with reference to the following example.

Figure 2E:
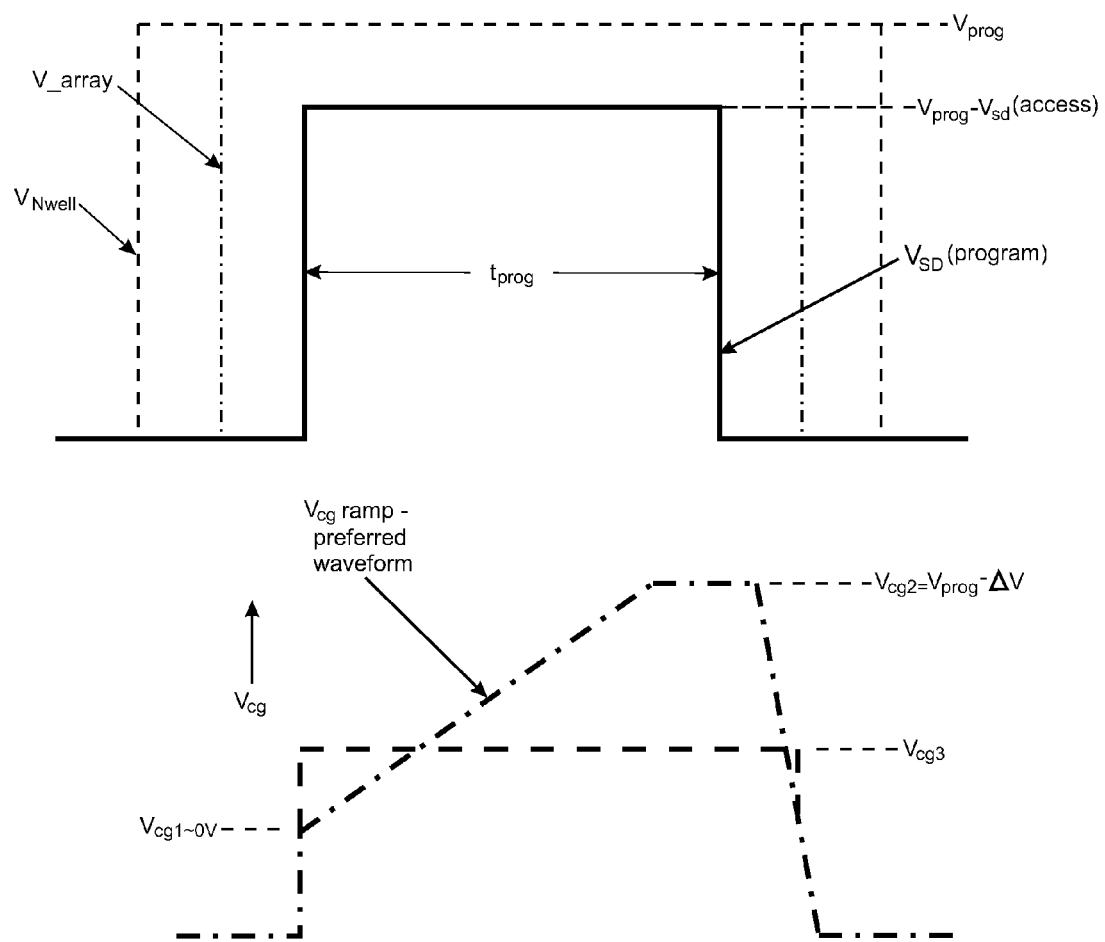
FIG. 2E illustrates an exemplary timing diagram of exemplary voltages related to programming the exemplary memory cell in accordance with another embodiment of the invention.

FIG. 2E illustrates an exemplary timing diagram of exemplary voltages related to programming the exemplary memory cell in accordance with another embodiment of the invention. As the diagram illustrates, the bias voltage on the N-Well is applied first to prevent forwarding biasing of the junctions between the P+ regions of the transistor and the N-Well. Then, the bias voltage on the V_array line is applied next followed by taking the word line to zero (0) Volt to form the programming current. Then, in one embodiment, the bias voltage on the control gate is initiated to approximately zero (0) Volt ($V_{cg1}$) to start the programming of the program/erase transistor. Then, to improve programming efficiency as discussed above, the bias voltage on the control gate is ramped up to a voltage equal to the programming voltage Vprog (e.g., 4-7 V) minus $\Delta$V (e.g., 1-3 V)). Thereafter, the control voltage is rapidly lowered to its initial negative voltage. Then, the bias voltages on the V_array line and N-Well are consecutively lowered to ground potential. In another embodiment, the control gate may be initiated to a substantially constant voltage $V_{cg3}$ (e.g., 2-4 V) as shown during programming of the program/erase transistor.

To prevent program disturbance of unselected memory cells along the selected word line, the corresponding (unselected) bit lines are made to float. This prevents the formation of a programming current through the unselected program/erase PMOS transistor. However, a leakage current may still form through the program/erase transistor if it is already in a programmed state, because the V array bias, Vprog is applied to its source (S) through the access PMOS transistor. The leakage current would tend to charge the floating unselected bit line to Vprog. For an unselected transistor with its source connected to this bit line and with its access transistor gate connected to an unselected word line, this may cause electrons from the floating gate (FG) to leak to the channel of unselected program/erase transistors by F-N tunneling. The positive voltage Vcc (e.g., 2.5-4 V) on the unselected CG line forms a counter-bias to reduce leakage of electrons from the floating gate (FG) of previously programmed unselected cells.

To prevent program disturbance of unselected memory cells along the selected bit line, a positive voltage Vprog is applied to the unselected word line. This in effect turns off the corresponding access PMOS transistor to prevent the voltage V_array from being applied to the source (S) of the corresponding program/erase PMOS transistor.

To perform a read operation on a selected memory cell, the voltage on the selected bit line is raised to Vcc (e.g., ~2.5 to 4 Volts), the voltage on the selected word line is set to approximately ground potential, and the voltage on the V_array line is set to Vread (e.g., Vcc-Vsd, where Vsd is approximately 0.5-2 Volt). The selected word line being at approximately ground potential causes the access PMOS transistor to turn on. This causes the voltage Vread on the V_array line to be applied to the drain (D) of the program/erase transistor. Since the voltage Vread on the drain (D) of the program/erase transistor is slightly lower than the voltage (Vcc) on its source (S), a read current of approximately 10 to 100 microamps is formed, if the selected cell is in a programmed or ON state.

To increase the read current, a zero bias is applied to the selected CG line. To prevent a forward biasing of the program/erase transistor drain (D) to N-well junction, a positive voltage Vcc is applied to the selected N-well.

To prevent disturbance to unselected memory cells in unselected word lines, a positive voltage Vcc is applied to the unselected word lines. This in effect turns off the corresponding access transistor to prevent a read current to form through the corresponding program/erase transistor. To prevent disturbance to unselected memory cells in the selected word line, the unselected bit lines are floated so as to prevented the formation of a read current through the corresponding program/erase transistors. To minimize leakage of electrons from the floating gate (FG), a voltage Vcc is applied to the unselected CG lines so that the potential of the floating gate (FG) is substantially equal to the potential of the channel of the program/erase transistor.

To perform a block erase operation for erasing an array of memory cells, the voltage on the bit lines is set to Verase (e.g., ~6 Volts), and the voltage on the CG lines is set to Vcg_era (e.g., ~–5 Volts). About negative four (–4) Volts of the voltage Vcg_era couples to the floating gate (FG) while the voltage at the P type inversion channel of the program/erase transistor is at six (6) Volts. The resulting high field across the 70 Angstrom gate oxide removes the electrons from the floating gate (FG). It should be noted that the relatively high voltage difference (e.g., ~10 Volts) across the gate oxide of the program/erase transistor has approximately equal contributions from the negative CG voltage Vcg_era and the positive bit line voltage Verase. With this half-select scheme, the voltages on the CG lines and bit lines need to be approximately only half the voltage across the gate oxide. This reduces the high voltage requirements of the internal charge pump and decoder circuits for the CG lines and bit lines. However, it shall be understood that Verase and Vcg_era may be different voltages to achieve the approximate 10 Volt differential to achieve erasure of the corresponding cell. For example, Verase could be set to approximately 10 Volts and Vcg_era could be set to approximately ground potential.

During the block erase operation, the V_array lines are floated and word lines set to Vcc with N-Well set to Verase to prevent a forward biasing of the p-n junction at the interface of the program/erase PMOS transistor and the N-Well.

To perform a sector erase operation for erasing memory cells common to a word line, the voltage on the bit lines is set to Verase (e.g., ~6 Volts), and the voltage on the selected CG line is set to Vcg_era (e.g., ~–5 Volts). As discussed above with reference to the block erase operation, the resulting high field across the 70 Angstrom gate oxide due to the ~10 Volt potential difference removes the electrons from the floating gate (FG). However, it shall be understood that Verase and Vcg_era may be different voltages to achieve the approximate 10 Volt differential to achieve erasure of the corresponding cell. For example, Verase could be set to approximately 10 Volts and Vcg_era could be set to approximately ground potential. The voltage on the selected word lines is set to Vcc while the V_array line is set to float, the voltage on the N-Well is set to Verase, same as the corresponding biases in the Block Erase operation.

To reduce disturbance of unselected memory cells in unselected word lines, a voltage Vcc or 0V is applied to the corresponding CG lines, which counter-biases the Verase voltage applied to the corresponding bit lines to prevent erasure of those unselected memory cells. The voltage of the unselected word lines is set to Vcc to turn off the corresponding access PMOS transistors. Since all the bit lines are biased at Verase, substantially no leakage current flows even if the access transistors are not completely off.

To perform a bit or byte erase operation for erasing one or eight memory cells common to a word line, the voltage on the selected bit lines is set to Verase (e.g., ~6 Volts), and the voltage on the selected CG line is set to Vcg_era (e.g., ~−5 Volts). As discussed above with reference to the block and sector erase operations, the resulting high field across the 70 Angstrom gate oxide due to the ~10 Volt potential difference removes the electrons from the floating gate (FG). However, it shall be understood that Verase and Vcg_era may be different voltages to achieve the approximate 10 Volt differential to achieve erasure of the corresponding cell. For example, Verase could be set to approximately 10 Volts and Vcg_era could be set to approximately ground potential. The voltage on the selected word lines is set to Verase to turn off the access PMOS transistor, and the V_array line may be set to float. The voltage on the N-Well may be set to Verase to prevent a forward biasing of the p-n junction at the interface of the program/erase PMOS transistor and the N-Well.

To reduce disturbance of unselected memory cells in the selected word line, the corresponding unselected bit lines are set to approximately ground potential. This reduces the potential difference across the corresponding gate oxide to only four (4) Volts, which prevents erasure of the unselected memory cells. To reduce disturbance of unselected memory cells in unselected word lines, the corresponding CG lines are set to Vcc or ground potential, which reduces the potential difference across the gate oxide to prevent erasure of those unselected memory cells. The voltage of the unselected word lines is set to Verase to turn off the corresponding access PMOS transistors.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. A memory device, comprising:
    a p-doped substrate;
    a plurality of electrically-conductive bit lines extending along a bit line direction;
    a plurality of electrically-conductive word lines extending along a word line direction;
    a plurality of electrically-conductive control gate lines extending along said word line direction; and
    a plurality of memory cells arranged respectively along said bit lines and said word lines, wherein each memory cell comprises:
    a program/erase PMOS transistor including a first gate, and first and second P+ regions formed within an n-doped well which, in turn, is formed within said p-doped substrate, wherein said first P+ region is electrically connected to a corresponding bit line;
    an access PMOS transistor including a second gate, and third and fourth P+ regions formed within said n-doped well, wherein said third P+ region is electrically connected to said second P+ region of said program/erase PMOS transistor, and said second gate is electrically connected to a corresponding word line; and
    a control gate NMOS transistor formed in a p-doped pocket which, in turn, is formed within said n-doped well, wherein said control gate NMOS transistor comprises a third gate, and first and second N+ regions formed within said p-doped pocket, wherein said first and second N+ regions are electrically connected to a corresponding control gate line, and said third gate is electrically connected to said first gate of said program/erase PMOS transistor to form a floating gate.

2. The memory device of claim 1, wherein said first and second N+ regions are electrically connected to said corresponding control gate line by way of an electrically-conductive layer formed above said p-doped substrate.

3. The memory device of claim 1, further comprising a fifth P+ region formed within said p-doped pocket, wherein said fifth P+ region is electrically connected to said corresponding control gate line.

4. The memory device of claim 1, wherein said second P+ region of said program/erase PMOS transistor and said third P+ region of said access PMOS transistor are formed in a common P+ region.

5. The memory device of claim 1, wherein said floating gate comprises a doped polysilicon layer.

6. The memory device of claim 1, wherein a gate capacitance of the control gate NMOS transistor is large compared to the gate capacitance of the program/erase PMOS transistor.

7. The memory device of claim 1, further comprising a plurality of electrically-conductive bias lines extending along said word line direction, and wherein said fourth P+ region of said access PMOS transistor of each memory cell is electrically connected to a corresponding bias line.

8. The memory device of claim 7, wherein said bias line is electrically connected in common to the fourth P+ region of each access transistor of said memory cells.

9. A memory cell, comprising:
    a program/erase PMOS transistor including a first gate, and first and second P+ regions formed within an n-doped well formed within a p-doped substrate, wherein said first P+ region is electrically connected to a corresponding bit line;
    an access PMOS transistor including a second gate, and third and fourth P+ regions formed within said n-doped well, wherein said third P+ region is electrically connected to said second P+ region of said program/erase PMOS transistor, and said second gate is electrically connected to a corresponding word line; and
    a control gate NMOS transistor formed in a p-doped pocket which, in turn, is formed in said n-doped well, wherein said control gate NMOS transistor comprises a third gate, and first and second N+ regions formed within said p-doped pocket, wherein said first and second N+ regions are electrically connected to a corresponding control gate line, and said third gate is electrically connected to said first gate of said program/erase PMOS transistor to form a floating gate.

10. The memory cell of claim 9, wherein said first and second N+ regions are electrically connected to said corresponding control gate line by way of an electrically-conductive layer formed above said p-doped substrate.

11. The memory cell of claim 9, further comprising a fifth P+ region formed within said p-doped pocket, wherein said fifth P+ region is electrically connected to said corresponding control gate line.

12. The memory cell of claim 9, wherein said second P+ region of said program/erase PMOS transistor and said third P+ region of said access PMOS transistor are formed in a common P+ region.

13. The memory cell of claim 9, wherein said floating gate comprises a doped polysilicon layer.

14. The memory cell of claim 9, wherein a gate capacitance of the control gate NMOS transistor is large compared to the gate capacitance of the program/erase PMOS transistor.

15. The memory cell of claim 9, wherein said fourth P+ region of said access PMOS transistor is electrically connected to a corresponding bias line.

* * * * *